(12) United States Patent
Cao et al.

(10) Patent No.: US 7,990,722 B2
(45) Date of Patent: Aug. 2, 2011

(54) FASTENER AND ELECTRONIC DEVICE HAVING THE SAME

(75) Inventors: Lei Cao, Shenzhen (CN); Min Li, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, New Taipei (TW)

(*) Notice: Subject to any disclaimer, the term of this patent is extended or adjusted under 35 U.S.C. 154(b) by 95 days.

(21) Appl. No.: 12/581,178

(22) Filed: Oct. 19, 2009

(65) Prior Publication Data

US 2011/0038125 A1 Feb. 17, 2011

(30) Foreign Application Priority Data

Aug. 11, 2009 (CN) .......................... 2009 1 0305507

(51) Int. Cl.
*H05K 7/20* (2006.01)
(52) U.S. Cl. ........ 361/721; 361/704; 361/710; 361/719; 257/719; 165/80.3; 165/185
(58) Field of Classification Search .................. 361/702, 361/704, 707, 709, 710, 717, 719, 721
See application file for complete search history.

(56) References Cited

U.S. PATENT DOCUMENTS

| | | | | |
|---|---|---|---|---|
| 7,342,795 B2* | 3/2008 | Lee et al. | ....................... | 361/719 |
| 7,606,033 B2* | 10/2009 | Colbert et al. | ................ | 361/710 |
| 7,609,522 B2* | 10/2009 | Jin et al. | ........................ | 361/710 |
| 7,667,970 B2* | 2/2010 | Ma et al. | ....................... | 361/704 |
| 7,796,395 B2* | 9/2010 | Kim | ............... | 361/721 |
| 2009/0154102 A1* | 6/2009 | Zhou et al. | ..................... | 361/700 |
| 2009/0154110 A1* | 6/2009 | Ma et al. | ....................... | 361/719 |

* cited by examiner

*Primary Examiner* — Jayprakash N Gandhi
*Assistant Examiner* — Courtney Smith
(74) *Attorney, Agent, or Firm* — Frank R. Niranjan

(57) ABSTRACT

A fastener comprises a fastener post, a clasping element and an elastic element. The fastener post comprises a head, a post body and a threaded portion. The post body has a first extension section connecting with the head, a second extension section connecting with the threaded portion and a recess section connected between the first and second extension sections. The clasping element comprises an annular clasping body, a first clasping portion axially extending from the clasping body and a second clasping portion extending outwardly and then downwardly from the clasping body. The clasping body encloses the post body, the first clasping portion engages with the recess section of the post body, and the second clasping portion engages with the heat sink. The elastic element is set around the post body and located between the head and the clasping body.

19 Claims, 4 Drawing Sheets

FASTENER AND ELECTRONIC DEVICE HAVING THE SAME

BACKGROUND

1. Technical Field

The present disclosure relates to heat dissipation devices and, particularly, to a fastener attached to a heat sink, and an electronic device including such a heat sink and a fastener.

2. Description of Related Art

With the miniaturization development of the computers, electronic elements mounted on the motherboards of the computers are ever more dense; and spaces to mount heat sinks become ever smaller.

Conventionally, a number of bolts are used to secure a heat sink to a printed circuit board. First of all, the bolts each are secured to the heat sink by an O-shaped ring. The heat sink has a bottom plate defining a number of through holes therein. The O-shaped ring has an inner edge and an outer edge, and the inner edge of the O-shaped ring defines a number of slits to render the O-shaped ring some elasticity. Each bolt extends through the through hole of the bottom plate of the heat sink from top to bottom; the O-shaped ring sets around the bolt from bottom to top and clips on the bolt to thereby secure the bolt to the bottom plate of the heat sink. Then each bolt extends through the printed circuit board to secure the heat sink to the printed circuit board.

However, spaces between the bolt and the adjacent electronic elements are relatively small, therefore, the outer edge of the O-shaped ring may contact and interfere the adjacent electronic elements. During the securing process, the O-shaped ring may rotate together with the bolt; thus, the O-shaped ring may collide and damage the adjacent electronic elements.

What is needed, therefore, is a fastener and an electronic device including such a fastener which can overcome the described limitations.

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus. Moreover, in the drawings, like reference numerals designate corresponding parts throughout the several views.

DETAILED DESCRIPTION

Figure 1:
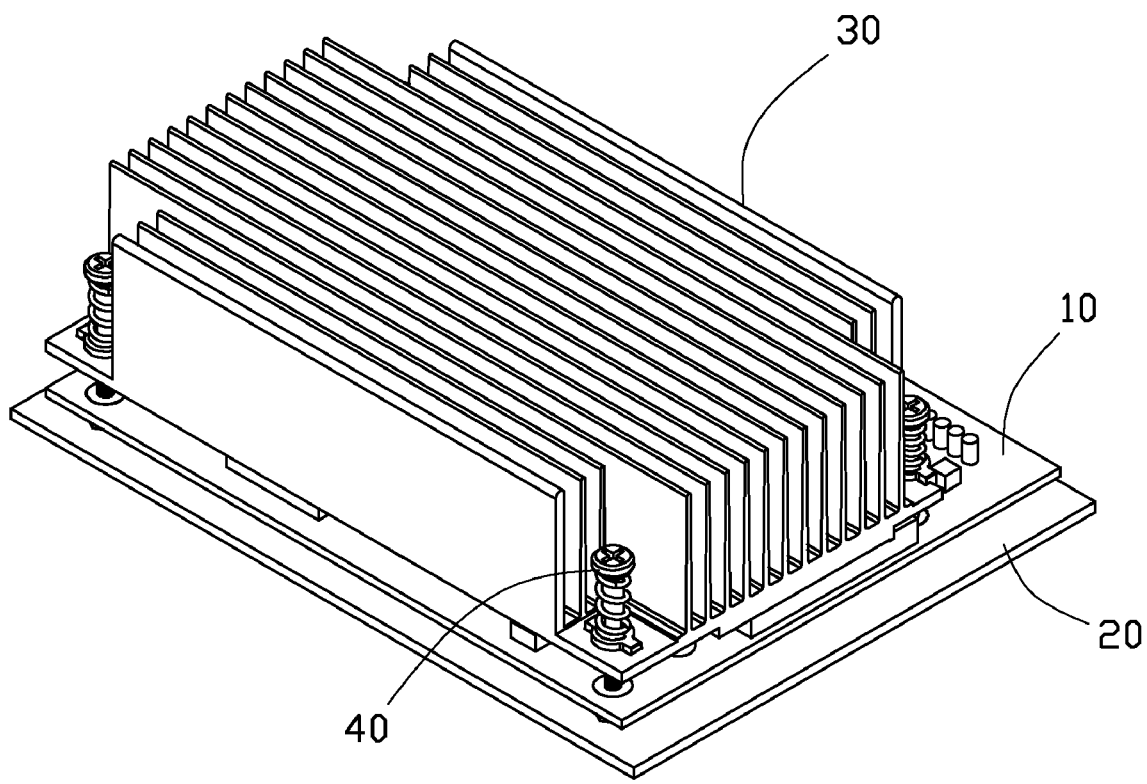
FIG. 1 is an assembled, isometric view of an electronic device in accordance with an embodiment of the disclosure.
Figure 2:
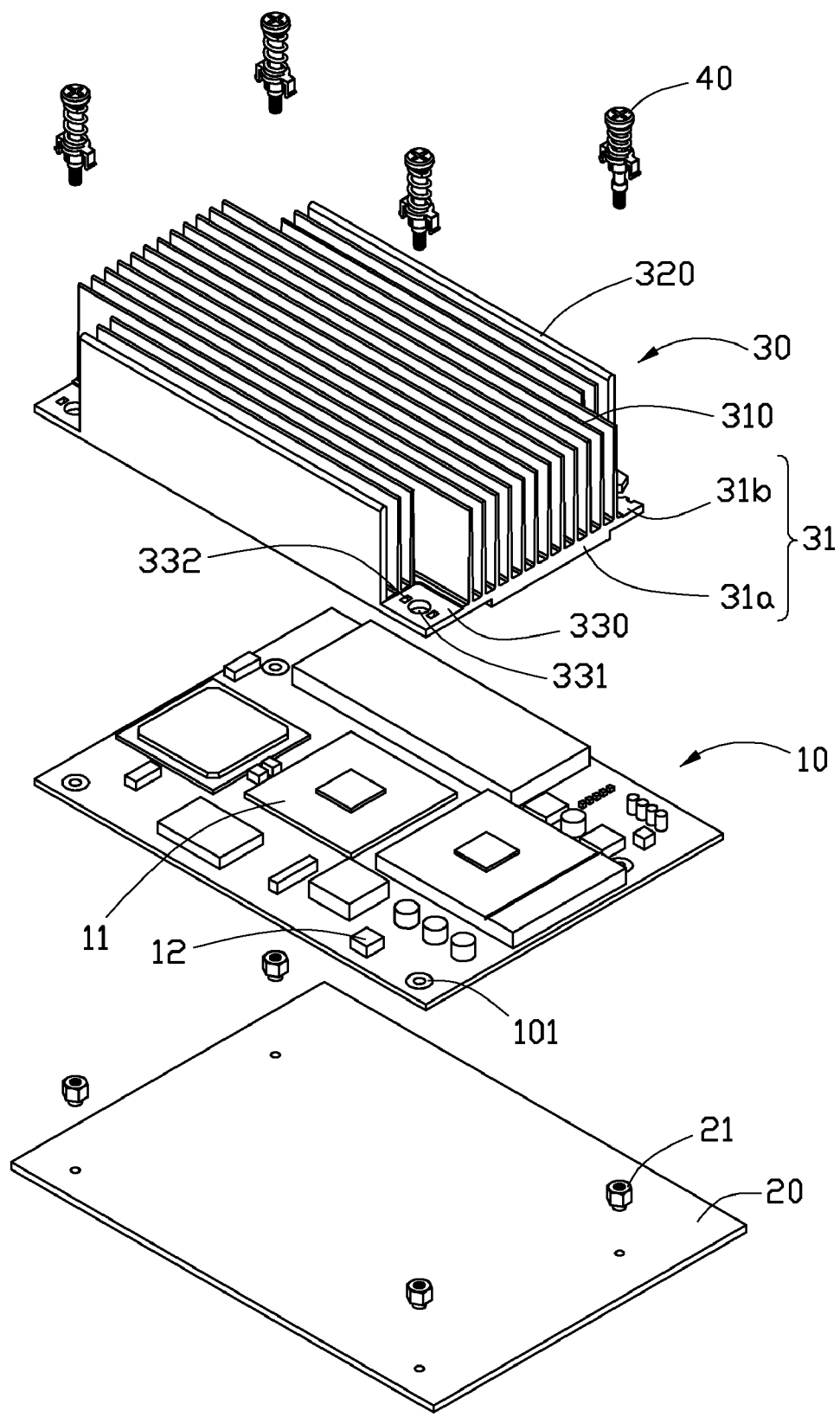
FIG. 2 is an exploded, isometric view of the electronic device of FIG. 1.

Referring to FIG. 1 and FIG. 2, an embodiment of an electronic device including a printed circuit board 10, a backboard 20, a heat sink 30 and four fasteners 40.

The printed circuit board 10 in accordance with the preferred embodiment is a motherboard, which supports a number of electronic elements thereon. For example, a number of first electronic elements 11 are mounted on a main area of the printed circuit board 10, and a number of second electronic elements 12 are mounted on an edge area of the printed circuit board 10. The first electronic elements 11 are main heat generating elements, and the heat sink 30 are configured to contact with the first electronic elements 11 to dissipate heat thereof. The printed circuit board 10 defines four first through holes 101 therein. The first through holes 101 generally surround the first electronic components 11.

Four nuts 21 are mounted to four corners of the backboard 20, respectively. The four nuts 21 each include a riveting portion 211 engaged with the backboard 20 and a screw portion 212 extending upwardly from the riveting portion 211. The screw portion 212 of each one of the four nuts 21 defines a screw hole 2120 along an axial direction thereof. The screw holes 2120 of the four nuts 21 of the backboard 20 align with the four first through holes 101 of the printed circuit board 10, respectively.

The heat sink 30 is integrally made of copper, aluminum or other materials with high heat dissipation capability. The heat sink 30 includes a rectangular bottom plate 31, a first fin set 310 and a second fin set 320. The bottom plate 31 includes a middle portion 31a and two lateral portions 31b connected with two sides of the middle portion 31a of the bottom plate 31. A thickness of the middle portion 31a is larger than that of each of the two lateral portions 31b. That is, top surfaces of the middle portion 31a and two lateral portions 31b are coplanar; a bottom surface of the middle portion 31a is below bottom surfaces of the two lateral portions 31b. Thus, spaces are formed between each of the bottom surfaces of the two lateral portions 31b and the printed circuit board 10, thereby facilitating setting fasteners 40 and mounting some periphery electronic elements therein.

The first fin set 310 is disposed on a top surface of the middle portion 31a of the bottom plate 31; the two second fin set 320 are disposed on top surfaces of the two lateral portions 31b of the bottom plate 31, respectively. The first fin set 310 includes a number of first fins protruding from the top surface of the middle portion 31a of the bottom plate 31 and extending along a lengthwise direction of the middle portion 31a of the bottom plate 31. The first fin set 310 communicates with two ends of the middle portion 31a of the bottom plate 31. A length of the first fin set 310 is equal to that of the middle portion 31a of the bottom plate 31. The first fins are parallel with each other and define a number of airflow passages therein. Each of the two second fin sets 320 includes a number of second fins protruding from the top surface of each of the two lateral portions 31b of the bottom plate 31 and extending along a lengthwise direction of the corresponding lateral portion 31b of the bottom plate 31. The second fins are parallel with each other and define a number of airflow passages therein. A length of the second fin set 320 is less than that of each of the two lateral portions 31b of the bottom plate 31. Each lateral portion 31b defines two engaging portions 330 each of which is located between one of two ends of each lateral portion 31b and one of two ends of a corresponding second fin set 320. Each engaging portion 330 defines a second through hole 331 corresponding to the first through hole 101 of the printed circuit board 10 and two clasping holes 332 located at two sides of the second through hole 331. In the present embodiment, a center of the second through hole 331 is equidistantly spaced from the two clasping holes 332.

Figure 3:
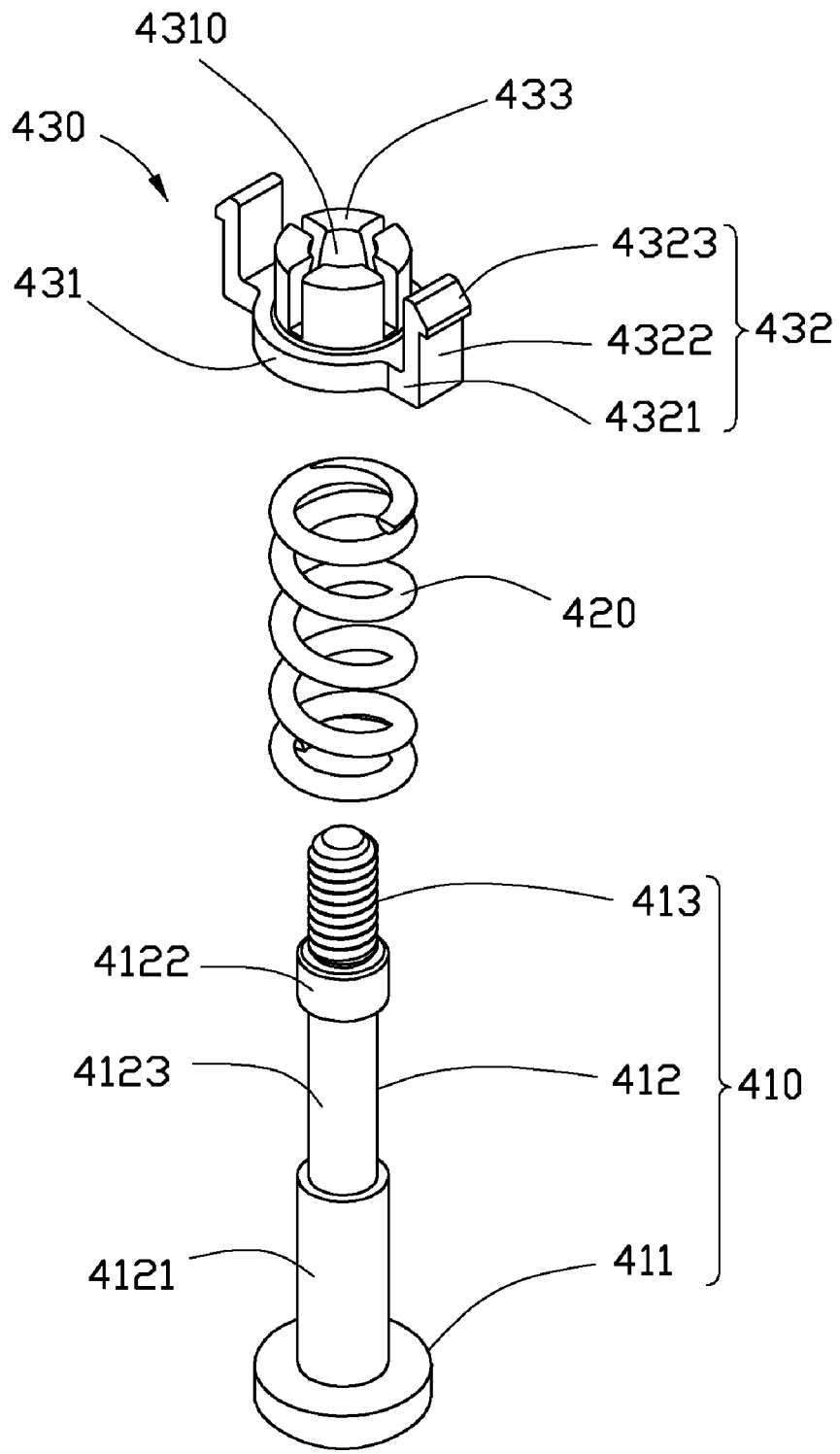
FIG. 3 is an enlarged view of a fastener of the electronic device of FIG. 1.
Figure 4:
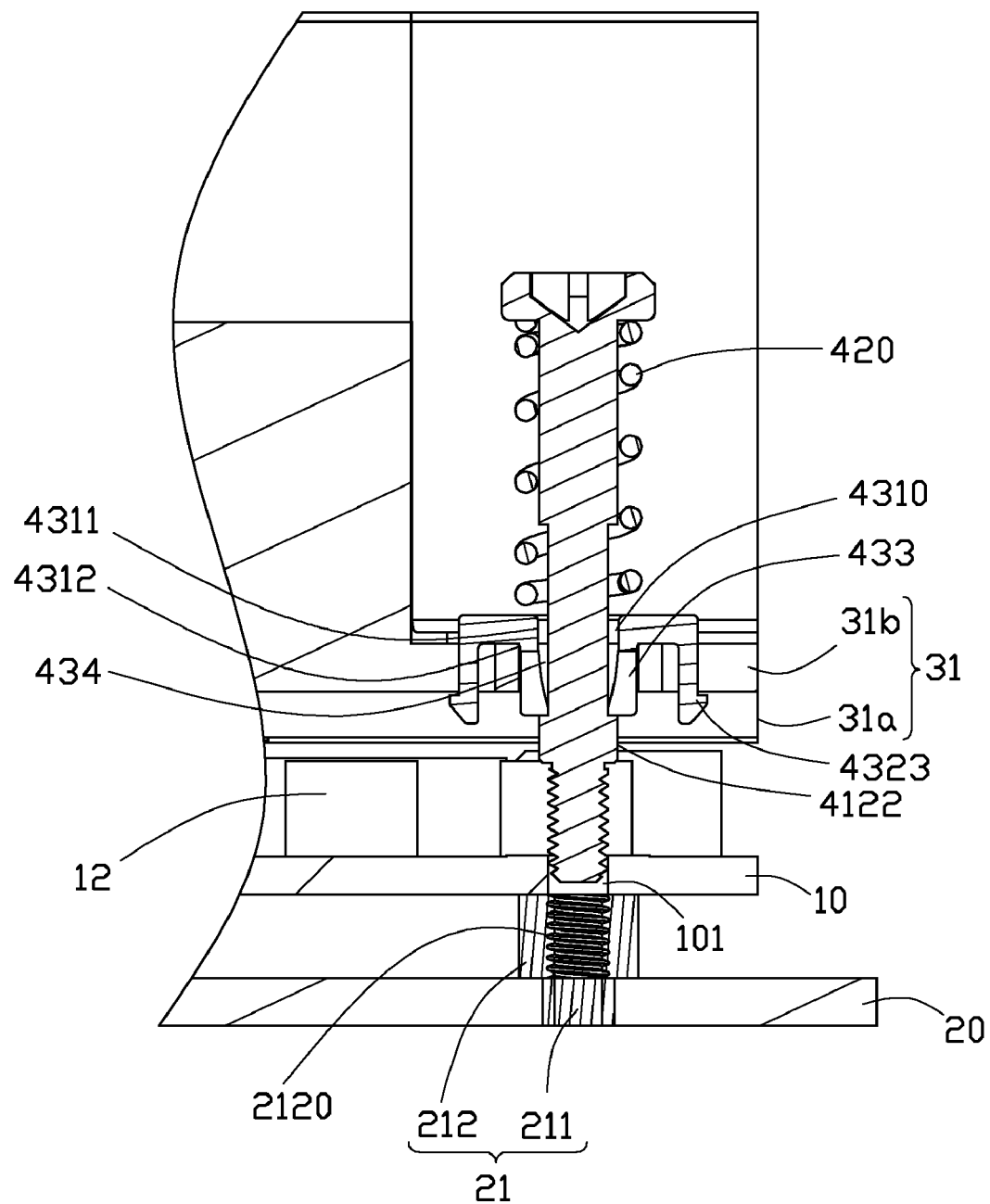
FIG. 4 is a partially sectional view of the electronic device of FIG. 1.

Referring to FIGS. 2 and 3, each of the fasteners 40 includes a fastener post 410, an elastic element 420 and a clasping element 430. The fastener post 410 is an integral structure and includes a head 411, a post body 412 and a threaded portion 413. The head 411 and the threaded portion 413 are connected to two opposite ends of the post body 412. The head 411, the post body 412 and the threaded portion 413 are coaxial. The post body 412 includes a first extension section 4121 connected with the head 411, a second extension section 4122 connected with the threaded portion 413 and a recess section 4123 connected between the first and second extension sections 4121, 4122. A diameter of the recess section 4123 is less than a diameter of each of the first and second extension sections 4121, 4122. A diameter of the threaded portion 413 is less than that of the second extension section 4122 of the post body 412. The elastic element 420 is a helical spring, and an inner diameter of the elastic element 420 is larger than the diameter of the post body 412 at the first and second extension sections 4121, 4122 and less than the diameter of the head 411.

The clasping element 430 is integrally made of plastic material. The clasping element 430 includes a first clasping portion to engage with the recess section 4123 of the post body 412 of the fastener post 410 and a second clasping portion to engage in the clasping holes 332 of the engaging portion 330 of the bottom plate 31 of the heat sink 30. In the present embodiment, the clasping element 430 includes an annular body 431, two clasps 432 and a number of resilient claws 433. The two clasps 432 function as the second clasping portion of the clasping element 430, the resilient claws 433 function as the first clasping portion of the clasping element 430. An inner diameter of the elastic element 420 is larger than an inner diameter of the body 431, and an outer diameter of the elastic element 420 is less than an outer diameter of the body 431; thus, the elastic element 420 abuts a top of the body 431 at a portion between inner and outer edges thereof, when the elastic element 420 and the clasping element 430 are assembled together. As a result, the body 431 of the clasping element 430 functions as a washer positioned between the elastic element 420 and the bottom plate 31 of the heat sink 30, thereby preventing the elastic element 420 from scraping the top surface of the bottom plate 31 of the heat sink 30 to produce a number of metallic scraps which may fall to the printed circuit board 10 to affect a normal work of the electronic elements mounted on the printed circuit board 10.

The body 431 of the clasping element 430 has an aperture 4310, an inner wall 4311 and an outer wall 4312. The resilient claws 433 extend downwardly from a bottom edge of the inner wall 4311 of the body 431 along an axis of the body 431. The resilient claws 433 are equidistantly arranged on a circumference of the bottom edge of the inner wall 4311 of the body 431 to enclose a cylinder 434 having an inverted cone-shaped hole. A diameter of a top end of the cylinder 434 where the resilient claws 433 connect with the body 431 is equal to that of the aperture 4310 of the body 431; a diameter of the bottom end of the cylinder 434 is less than that of the aperture 4310 of the body 431. The diameter of the bottom end of the cylinder 434 is less than that of the second extension section 4122 of the post body 412 and equal to or slightly larger than that of the recess section 4123 of the post body 412. The diameter of the cylinder 434 decreases gradually from the top end to the bottom end thereof.

The diameter of the aperture 4310 of the body 431 of the clasping element 430 is slightly larger than that of the second extension section 4122 of the post body 412 of the fastener post 410 to enable the second extension section 4122 of the post body 412 extending therethrough to enter the cylinder 434. The diameter of the bottom end of the cylinder 434 is less than that of the aperture 4310 of the body 431 of the clasping element 430. When the second extension section 4122 of the post body 412 of the fastener post 410 moves to the bottom end of the cylinder 434, the resilient claws 433 expand outwardly to enable the second extension section 4122 of the post body 412 to pass through the cylinder 434. The resilient claws 433 fitly clasp the recess section 4123 of the post body 412 of the fastener post 410 and abut a top of the second extension section 4122 of the post body 412 of the fastener post 410. In addition, the clasping element 430 can slide on the recess section 4123 of the post body 412 along a lengthwise direction of the post body 412. An outer diameter of a circle cooperatively defined by outer peripheries of the claws 433 is equal to or slightly less than a diameter of the second through hole 331 of the bottom plate 31 of the heat sink 30 to enable the claws 433 to fitly/interferentially engage in the second through hole 331 of the bottom plate 31 of the heat sink 30, whereby the resilient claws 433 are restrained by the bottom plate 31 to firmly engage with the fastener post 410.

The two clasps 432 are symmetrically disposed on two sides of the center of the body 431. In detail, each clasp 432 includes a horizontal portion 4321 extending outwardly from the outer wall 4312 of the body 431, a vertical portion 4322 extending downwardly from a free end of the horizontal portion 4321, and a hook 4323 extending outwardly from a free end of the vertical portion 4322. The vertical portion 4322 of each clasp 432 is resilient to enable the hook 4323 thereof to engage the bottom of the engaging portion 330 of the bottom plate 31 of the heat sink 30 after the vertical portion 4322 has been inserted through the clasping hole 332. It is understood that the number of the clasps 432 of the clasping element 430 and the clasping holes 332 of the engaging portion 330 of the heat sink 30 is not limited, so long as the clasping element 430 can be secured to the heat sink 30.

For assembling the fastener 40, the elastic element 420 and the clasping element 430 are mounted onto the fastener post 410 in sequence; the elastic element 420 is located between the head 411 of the fastener post 410 and the body 431 of the clasping element 430. The threaded portion 413 and the second extension section 4122 of the post body 412 are brought to extend through the body 431 of the clasping element 430 and the cylinder 434 enclosed by the resilient claws 433; the resilient claws 433 fitly clasp the recess section 4123 of the post body 412 of the fastener post 410, whereby the elastic element 420, the clasping element 430 and the fastener post 410 are assembled together.

For fixing each of the fasteners 40 to the heat sink 30, the second extension section 4122 of the post body 412 of the fastener post 410 and the resilient claws 433 attached on the recess section 4123 of the post body 412 are inserted in the second through hole 331 of the engaging portions 330 of the bottom plate 31 of the heat sink 30; the threaded portion 413 of the post body 412 of the fastener post 410 extends through the second through hole 331 and locates below a bottom surface of the lateral portion 31*b* of the bottom plate 31 of the heat sink 30. The two clasps 432 of the clasping element 430 clasp in the two clasping holes 332 of the engaging portion 330 of the bottom plate 31 of the heat sink 30, respectively, whereby the two hooks 4323 of the two clasps 432 abut against the bottom surface of the lateral portion 31*b* of the bottom plate 31 of the heat sink 30. By this manner, the four fasteners 40 can be assembled to the heat sink 30. In assembling the fastener 40 to the heat sink 30, the wall defining the second through hole 331 of the engaging portion 330 of the bottom plate 31 of the heat sink 30 can prevent the fastener post 410 from disengaging from the clasping element 430, thereby facilitating installing the fastener post 410 to the engaging portion 330 of the bottom plate 31 of the heat sink 30.

For securing the heat sink 30 to the printed circuit board 10 and the backboard 20, the threaded portions 413 of the four fasteners 40 sequentially extend through four first through holes 101 of the printed circuit board 10 and screw in the four screw portions 212 of the four nuts 21 mounted on the backboard 20, whereby four corners of the bottom plate 31 of the heat sink 30 are secured to the printed circuit board 10 and the backboard 20. Simultaneously, the middle portion 31a of the bottom plate 31 of the heat sink 30 thermally contacts with the first electronic elements 11. It is understood that the threaded portion 413 of each of the fasteners 40 and the nut 21 of the backboard 20 can be other engagement relations, so long as the heat sink 30 can be secured to the printed circuit board 10 and the backboard 20.

Regarding an assembly of the heat sink 30, the printed circuit board 10 and the backboard 20, the spaces defined between the two lateral portions 31b of the heat sink 30 and the printed circuit board 10 is used to install the fasteners 40. In the assembly of the heat sink 30, the printed circuit board 10 and the backboard 20, only the hooks 4323 of the clasps 432 of the clasping element 430 locate in the spaces between the lateral portions 31b of the bottom plate 31 of the heat sink 30 and the printed circuit board 10. The hooks 4323 of the clasps 432 of the clasping element 430 have a relatively small size, whereby the spaces for installing the fasteners 40 can be effectively reduced. In the present embodiment, a height of each of the hooks 4323 is about 2 millimeters. In addition, after the two clasps 432 of the clasping element 430 clasp in the two clasping holes 332 of the engaging portion 330 of the bottom plate 31 of the heat sink 30, when the fastener post 410 is rotated to screw the threaded portion 413 thereof into the screw portion 212 of a corresponding nut 21 mounted on the backboard 20, the two clasps 432 do not rotate together with the fastener post 410, thereby avoiding an interference between the clasps 432 and neighboring electronic elements thereof.

It is to be understood, however, that even though numerous characteristics and advantages of the present embodiments have been set forth in the foregoing description, together with details of the apparatus and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

The invention claimed is:

1. A fastener for securing a heat sink to a printed circuit board, the fastener comprising:
   a fastener post comprising a head, a post body and a threaded portion, the post body having a first extension section connected with the head, a second extension section connected with the threaded portion and a recess section connected between the first and second extension sections;
   a clasping element comprising an annular clasping body, a first clasping portion extending from the clasping body along an axis of the clasping body and a second clasping portion extending outwardly and then downwardly from the clasping body, wherein the clasping body is mounted around the post body of the fastener post, the first clasping portion engages with the recess section of the post body of the fastener post to restrict the fastener post from moving relative to the clasping body, and the second clasping portion engages with the heat sink; and
   an elastic element mounted around the post body of the fastener post and located between the head and the clasping body of the clasping element.

2. The fastener of claim 1, wherein the first clasping portion comprises a plurality of resilient claws, and the second clasping portion comprises a plurality of clasps.

3. The fastener of claim 2, wherein the clasping body comprises an inner wall and an outer wall, the inner wall defines an aperture, the resilient claws extend downwardly from a bottom edge of the inner wall of the clasping body along the axis of the clasping body.

4. The fastener of claim 3, wherein the resilient claws are equidistantly arranged on a circumference of the bottom edge of the inner wall of the clasping body to enclose a cylinder having an inverted cone-shaped hole communicating with the aperture of the clasping body.

5. The fastener of claim 4, wherein a diameter of a top end of the cylinder is equal to that of the aperture of the clasping body, and a diameter of a bottom end of the cylinder is less than that of the aperture of the clasping body.

6. The fastener of claim 5, wherein the diameter of the bottom end of the cylinder is less than that of the second extension section of the post body of the fastener post and is no less than that of the recess section of the post body of the fastener post.

7. The fastener of claim 5, wherein the diameter of the cylinder decreases gradually from the top end to the bottom end thereof.

8. The fastener of claim 3, wherein each of the clasps comprises a horizontal portion extending outwardly from the outer wall of the clasping body, a vertical portion extending downwardly from a free end of the horizontal portion, and a hook extending outwardly from a free end of the vertical portion.

9. The fastener of claim 1, wherein the elastic element is helical spring, an inner diameter of the elastic element is larger than an inner diameter of the clasping body of the clasping element, and an outer diameter of the elastic element is less than an outer diameter of the clasping body of the clasping element.

10. An electronic device, comprising:
    a heat sink comprising a bottom plate defining a plurality of first through holes and a plurality of clasping holes;
    a printed circuit board defining a plurality of second through holes; and
    a plurality of fasteners each comprising:
       a fastener post comprising a head, a post body and a threaded portion, the post body having a first extension section connected with the head, a second extension section connected with the threaded portion and a recess section connected between the first and second extension sections, the threaded portion of each of the fasteners extending through a corresponding one of the first through holes of the bottom plate of the heat sink and a corresponding one of the second through holes of the printed circuit board;
       a clasping element comprising an annular clasping body, a first clasping portion extending from the clasping body along an axis of the clasping body and a second clasping portion extending outwardly and then downwardly from the clasping body, wherein the clasping body is set around the post body of the fastener post, the first clasping portion engages with the recess section of the post body of the fastener post to restrict the fastener post from moving relative to the clasping body, and the second clasping portion engages in the clasping holes of the bottom plate of the heat sink; and
       an elastic element set around the post body of the fastener post and located between the head and the clasping body of the clasping element.

11. The electronic device of claim 10, further comprising a backboard mounted with a plurality of nuts therein, the threaded portion of the fastener post of each of the fasteners engages in a corresponding one of the nuts.

12. The electronic device of claim 10, wherein the first clasping portion comprises a plurality of resilient claws, and the second clasping portion comprises a plurality of clasps.

13. The electronic device of claim 12, wherein the clasping body comprises an inner wall and an outer wall, the inner wall defines an aperture, the resilient claws extend downwardly from a bottom edge of the inner wall of the clasping body along the axis of the clasping body.

14. The electronic device of claim 13, wherein the resilient claws are equidistantly arranged on a circumference of the bottom edge of the inner wall of the clasping body to enclose a cylinder having an inverted cone-shaped hole communicating with the aperture of the clasping body.

15. The electronic device of claim 14, wherein a diameter of a top end of the cylinder is equal to that of the aperture of the clasping body, and a diameter of a bottom end of the cylinder is less than that of the aperture of the clasping body.

16. The electronic device of claim 15, wherein the diameter of the bottom end of the cylinder is less than that of the second extension section of the post body of the fastener post and is no less than that of the recess section of the post body of the fastener post.

17. The electronic device of claim 15, wherein the diameter of the cylinder decreases gradually from the top end to the bottom end thereof.

18. The electronic device of claim 13, wherein each of the clasps comprises a horizontal portion extending outwardly from the outer wall of the clasping body, a vertical portion extending downwardly from a free end of the horizontal portion, and a hook extending outwardly from a free end of the vertical portion.

19. The electronic device of claim 10, wherein the elastic element is helical spring, an inner diameter of the elastic element is larger than an inner diameter of the clasping body of the clasping element, and an outer diameter of the elastic element is less than an outer diameter of the clasping body of the clasping element.

* * * * *